United States Patent [19]

Ohba

[11] 4,360,855
[45] Nov. 23, 1982

[54] INJECTOR DRIVE CIRCUIT

[75] Inventor: Masahiro Ohba, Okazaki, Japan

[73] Assignee: Nippondenso Co., Ltd., Kariya, Japan

[21] Appl. No.: 209,120

[22] Filed: Nov. 21, 1980

[30] Foreign Application Priority Data

Nov. 27, 1979 [JP] Japan .............................. 54-154028

[51] Int. Cl.³ .......................................... H01H 47/32
[52] U.S. Cl. .................................... 361/154; 361/153; 123/490
[58] Field of Search .............. 361/152, 153, 154, 196, 361/198, 100, 101; 123/490; 307/200 B

[56] References Cited

U.S. PATENT DOCUMENTS

| | | | |
|---|---|---|---|
| 4,092,717 | 5/1978 | Dinunzio | 123/490 X |
| 4,134,367 | 1/1979 | Ferry et al. | 123/490 X |
| 4,158,149 | 6/1979 | Otofuji | 307/200 B X |
| 4,173,030 | 10/1979 | Rabe | 361/196 X |
| 4,180,026 | 11/1979 | Schulzke et al. | 123/490 |
| 4,225,898 | 9/1980 | Weber et al. | 361/154 |
| 4,234,903 | 11/1980 | Harper | 361/154 |

Primary Examiner—Reinhard J. Eisenzopf
Attorney, Agent, or Firm—Cushman, Darby & Cushman

[57] ABSTRACT

An injector drive circuit in which the injector is opened in response to a pulse signal with a time width which determines the quantity of the fuel to be supplied to the engine. To the injector, a circuit for supplying a peak current at the time of fuel injection and a field effect transistor for supplying a holding current after supply of the peak current are connected in parallel. In response to the control signal from a fuel injection amount control circuit, the peak current is supplied to the injector, and upon detection that a predetermined peak current has been supplied to the injector, the peak current is stopped. Thereafter, by controlling the gate of the field effect transistor, the holding current is supplied to the injector through the field effect transistor, until the control signal is stopped.

6 Claims, 6 Drawing Figures

INJECTOR DRIVE CIRCUIT

BACKGROUND OF THE INVENTION

The present invention relates to an injector drive circuit for a fuel injection system comprising a control circuit for calculating the amount of the fuel supplied to the engine as a time width of an electrical pulse and an injector with the valve thereof opened in accordance with the time width of the electrical pulse supplied from the control circuit, or more particularly to an injector drive circuit for the fuel injection system, in which the current supply to the injector is controlled optimally.

An example of the conventional drive circuits of this type is disclosed in Japanese Patent Laid-Open Publication No. 125932/77 corresponding to U.S. Pat. No. 4,180,026. FIG. 1 shows a schematic block diagram showing the same and FIG. 2 shows waveforms of operation of various parts thereof. This example will be explained with reference to FIGS. 1 and 2. When a comparator is supplied with a pulse signal $\tau$ from a control circuit ECU for calculating the amount of the fuel supplied to the engine as an injection time width as shown in FIG. 2(a), the output of the comparator 1 becomes low level as shown in FIG. 2(b). This signal is converted into high level at a voltage converter circuit 2 thereby to turn on a transistor Tr1. A current begins to flow in an injector 130, so that the emitter voltage of the transistor Tr1 begins to increase slowly as shown in FIG. 2(e) by the particular current and the resistor R1 connected between the emitter and the earth. When this voltage exceeds the first reference voltage V1 of the comparator 3, the comparator 3 reaches a high level as shown in FIG. 2(c). This high-level signal is applied to the voltage converter circuit 2 in a circuit configuration to turn off the transistor Tr1. Upon the turning off of the transistor Tr1, the current stops flowing in the injector 130, that is, the current more than the peak value corresponding to the first reference voltage V1 does not flow in the injector 130. Then the emitter voltage of the transistor Tr1 is reduced to low level, and the output of the comparator 3 is also reduced to low level again as shown in FIG. 2(c). In view of the fact that signal $\tau$ from the control circuit ECU is still at high level and that the output of the comparator 1 is at low level, however, the current begins to flow again in the injector 130 as soon as the output of the comparator 3 is reduced to low level. The circuit is so configured that at the time point when the emitter voltage of the transistor Tr1 exceeds the first reference voltage V1 of the comparator 3 and the comparator 3 becomes high in level, the output of the bistable multivibrator 4 is reduced to low level as shown in FIG. 2(d), whereby the reference voltage of the comparator 3 is changed to the second reference voltage V2 set lower than the voltage V1. For this reason, when the current begins to flow again in the injector 130 and the emitter voltage of the transistor Tr1 increases as shown in FIG. 2(e), the output of the comparator 3 reaches a high level as shown in FIG. 2(c) at the time point when the emitter voltage of the transistor Tr1 exceeds the second reference voltage V2 of the comparator 3, so that the transistor Tr1 is turned off and the emitter voltage of the transistor Tr1 is reduced to low level, thus reducing the output of the comparator 3 to low level again. In this way, the current flowing in the injector 130 is maintained at a holding current corresponding to the second reference voltage V2. This holding current is small as compared with the peak current and substantially constant. When the signal $\tau$ applied to the comparator 1 is reduced from high level to low level, the transistor Tr1 is turned off followed by the signal $\tau$ increasing from low level to high level, in preparation for the next cycle of similar operation. A delay circuit 5 is for delaying somewhat the timing of reduction of the bistable multivibrator 4 to low level, so that the timing of the turning on of the transistor Tr2 is delayed and thus the injector valve opening time is advanced by use of the reverse electromotive force generated by the turning off of the injector 130 when the peak current of the injector 130 is reached. The flyback control section 6 is for absorbing the reverse electromotive force generated by the turning on and off of the transistor Tr1 in the operation range of the holding current after the decrease of the output of the bistable multivibrator 4 to low level and the similar decrease of the output of the delay circuit 5 to low level, thus preventing the injector from being easily closed by the reverse electromotive force.

The conventional injector drive circuit of this type has the following disadvantages:

(1) The circuit is complicated.

(2) The peak current or the holding current (that is, the first and the second reference voltages V1 and V2 of the comparator 3) cannot be adjusted independently, and the adjustment takes a long time.

(3) If the frequency of setting the holding current by feedback is increased, the effect of the malfunction of other circuits cannot be ignored. If it is reduced, on the other hand, the variation in the holding current is enlarged, and when the system is mounted in a car, the injector is likely to open or close by the vibrations of the car.

SUMMARY OF THE INVENTION

The object of the present invention is to provide an injector drive circuit comprising a series circuit of a field effect transistor (FET) and an injector, a switching circuit for deciding whether or not the peak current is supplied to the injector at the time when the injector is open, means for maintaining the gate potential of the field effect transistor at a set potential during the period of the signal $\tau$ after supply of the peak current, and means for maintaining the current supply to the injector at a holding current corresponding to the set potential level, in which the holding current is regulated easily by a simple configuration and the holding current is set at the gate potential of the field effect transistor, thus liberating the system from the effect of car vibrations unlike in the conventional systems.

According to the present invention, the holding current for holding the valve opening after the opening operation of the injector valve is supplied from the field effect transistor, and the circuit function for setting this holding current is independent of the circuit function for determining the peak current value causing the valve opening operation of the injector. Thus it is possible to regulate each current easily independently. Further, the value of the holding current is regulated not by the feedback oscillation but by the resistance value between the drain and the source depending on the gate potential of the field effect transistor unlike in the conventional systems. As a result, the effect on the other circuits is completely eliminated on the one hand and there is no variation of the current value on the other hand.

According to another aspect of the present invention, the peak current may be supplied not only to the field effect transistor but also to a power transistor, thus making it possible to supply a sufficient amount of current to the injector.

DESCRIPTION OF THE PREFERRED EMBODIMENTS

Figure 3:
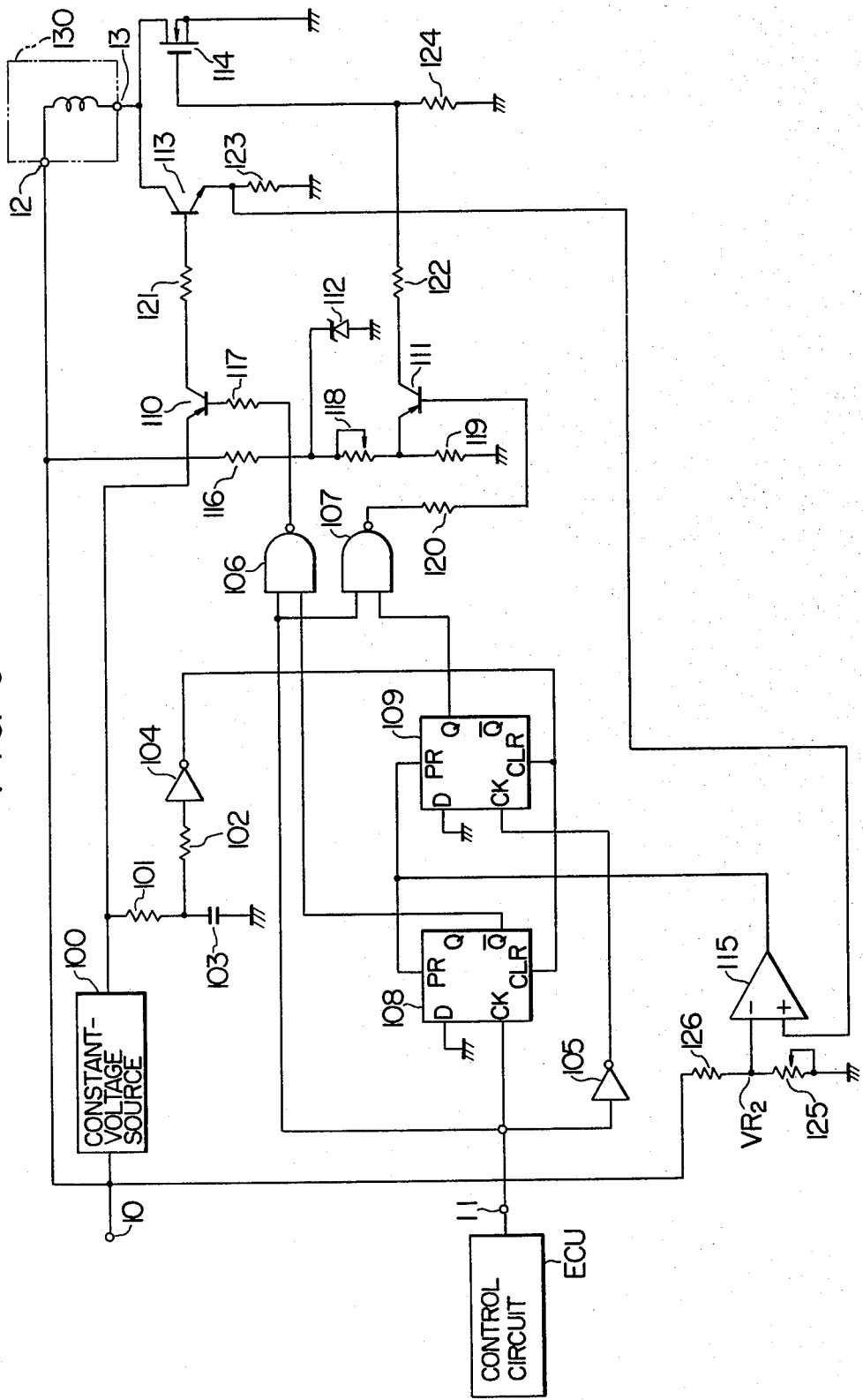
FIG. 3 is an electrical circuit diagram showing a first embodiment of the present invention.

The present invention will be described with reference to the embodiments shown in the drawings. A first embodiment is shown in FIG. 3. In this drawing, a terminal 10 is connected to a battery for supplying 12 volts to the injector and the circuits. A terminal 11 is impressed with a control signal $\tau$ from a control circuit ECU for controlling the operation of the valve of an injector 130, namely, for controlling the amount of the fuel injected. Terminals 12 and 13 are connected across the injector 130 to pass a current for operating the valve of the injector 130. Reference numeral 100 shows a constant-voltage source which, in this embodiment, supplies a constant voltage of 8 V to inverters 104 and 105, NAND gates 106 and 107, D-type flip-flops 108 and 109 and a PNP transistor 110. Numeral 115 shows a comparator, numeral 111 a PNP transistor, and numeral 112 a zener diode for providing a constant voltage of, say, 5.0 V in this embodiment. Numeral 113 shows an NPN power transistor, numeral 114 a MOS type N channel field effect transistor, numeral 101 a resistor of 100 K$\Omega$, numeral 102 a resistor of 10 K$\Omega$, numeral 103 a capacitor of 0.1 $\mu$F, numeral 116 a resistor of 1 K$\Omega$, and numeral 118 a variable resistor which has a maximum resistance value of 5 K$\Omega$ in this embodiment. Numeral 117 shows a resistor of 22 K$\Omega$, numeral 119 a resistor of 22 K$\Omega$, numeral 120 a resistor of 22 K$\Omega$, numeral 121 a resistor of 180 $\Omega$, numeral 122 a resistor of 1 K$\Omega$, numeral 123 a resistor of 0.2 $\Omega$, numeral 124 a resistor of 10 K$\Omega$, and numeral 125 a variable resistor which has a maximum resistance value of 2.0 K$\Omega$ in this embodiment. Numeral 126 is a resistor of 10 K$\Omega$.

Figure 4:
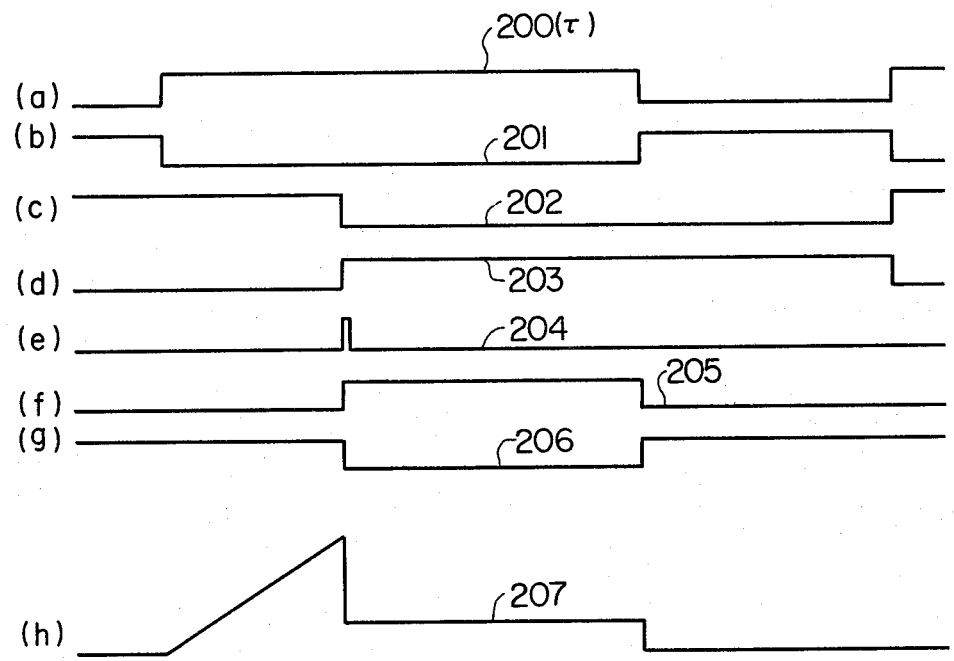
FIG. 4 shows output waveforms produced at various parts of FIG. 3.

The operation of the circuit having the abovementioned configuration will be explained with reference to the operating waveforms shown in FIG. 4. In this diagram, the waveform 200 shown in (a) represents a control signal (injection pulse signal) $\tau$ from the control circuit ECU which is applied to the terminal 11, the waveform 201 shown in (b) represents a control signal reversed in polarity by the inverter 105, the waveform 202 shown in (c) represents the $\overline{Q}$ output of the D-type flip-flop 108, the waveform 203 shown in (d) represents the output of the NAND gate 106, the waveform 204 shown in (e) represents the output of the comparator 115, the waveform 205 shown in (f) represents the Q output of the D-type flip-flop 109, the waveform 206 shown in (g) represents the output of the NAND gate 107, and the waveform 207 shown in (h) represents the current flowing in the injector 130.

When the battery power is supplied to the terminal 10 at the time of engine start in response to the power throw in, a high level signal is generated at the output of the inverter 104 by a reset signal generator circuit including resistors 101 and 102, a capacitor 103 and an inverter 104, thus resetting the D-type flip-flops 108 and 109. The capacitor 103 is charged to the same voltage level as the source voltage by the resistor 101, thus reducing the output of the inverter 104 to low level. The Q output of the D-type flip-flop 108 and 109 is at low level and the $\overline{Q}$ output thereof is at high level when the flip-flops 108 and 109 are reset. When the control signal applied to the terminal 11 is raised from low level to high level, namely, when the injection pulse $\tau$ is supplied to the terminal 11, the $\overline{Q}$ output of the flip-flops 108 and 109 remains at high level since the D terminal of the D-type flip-flop 108 is grounded. Thus, both the inputs of the NAND gate 106 is raised to high level and therefore the output thereof is reduced to low level. The base current of the PNP transistor 110 flows through the resistor 117, and the collector current flows in the PNP transistor 110. This collector current forms the base current of the power transistor 113, and therefore the power transistor 113 becomes conductive so that current begins to flow in the injector 130. Let the internal resistance of the injector 140 be Ro, the supply voltage to the injector be E and the inductance thereof be L. Then, the current represented by the inclined part of the current waveform shown in 207 of FIG. 4(h) increases in the manner shown by the equation below.

$$I = \frac{E_o}{R}\left(1 - \theta^{-\frac{R_o}{L}t}\right) \tag{1}$$

With the increase in the current flowing in the injector 130, the voltage at the junction point of the emitter of the power transistor 113 and the resistor 123 increases. Since this voltage is connected to the plus input terminal of the comparator 115, the voltage at this plus input terminal also increases. When the voltage at this plus input terminal exceeds the set value at the minus input terminal of the comparator 115 which is set by the resistor 126 and the variable resistor 125 (when the current to the injector 130 reaches the peak value corresponding to this set value), the output of the comparator 115 is raised from low level to high level. This output is connected to the preset terminal of the D-type flip-flops 108 and 109, and therefore the $\overline{Q}$ output of the D-type flip-flop 108 is reduced to low level, while the Q output of the D-type flip-flop 109 is raised to high level. As a result, the output of the NAND gate 106 is raised to high level, so that the base current of the transistor 110 stops flowing and so does the base current of the power transistor 113. Thus the power transistor 113 is cut off, and the current stops flowing in the injector 130. In view of the fact that the output of the NAND gate 107 is reduced to low level, however, the base current of the transistor 111 flows and thus the transistor 111 begins to conduct. As a result, the gate of the MOS FET 114 is impressed with a set voltage substantially equal to a voltage of the zener diode 112 as divided by the variable resistor 118 and the resistor 119. This gate voltage is controlled by the variable resistor in such a manner that almost the minimum holding current required for keeping the valve of the injector 130 to be opened flows to the injector 130 through the field effect transistor 114. This holding current is kept at about 1.2 A for 12 V of the battery voltage according to this embodiment. This state continues to be kept until the control signal 200 is reduced from high to low level, namely, during the period when the injection pulse signal τ is applied. When the control signal 200 is reduced from high to low level, the clock input terminal of the D-type flip-flop 109 is raised from low level to high level. Therefore, the low-level state of the D input terminal of the D-type flip-flop is taken in, thus reducing the Q output to low level. The output of the NAND gate 107 is raised to high level, the base current of the transistor 111 stops flowing, the transistor 111 is cut off, the gate voltage of the MOS field effect transistor 114 is reduced to zero, and the MOS field effect transistor 114 is cut off, thus stopping the current flow in the injector. In this way, when the control signal 200 is raised from low level to high level, the above-mentioned operation is repeated.

Figure 1:
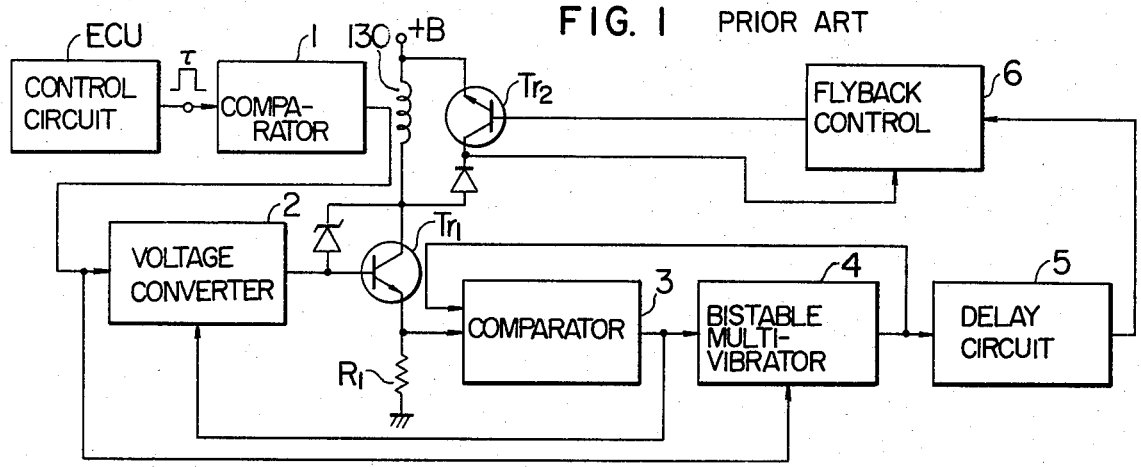
FIG. 1 is a block diagram showing a conventional injector drive system.
Figure 2:
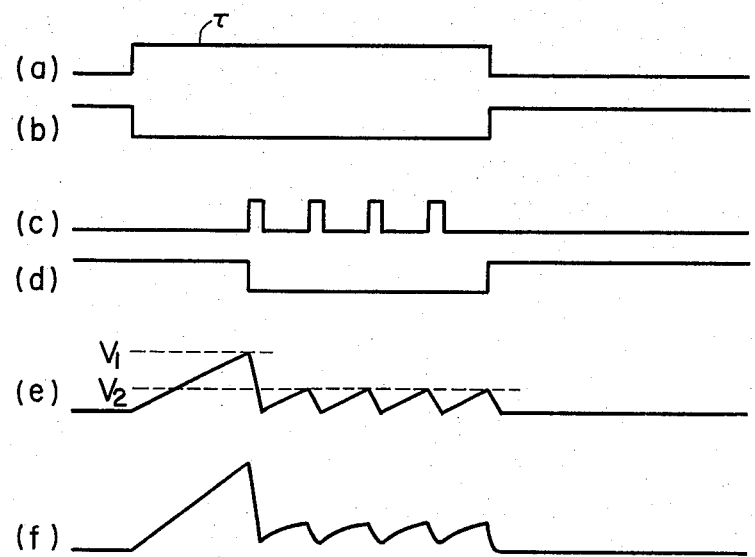
FIG. 2 shows output waveforms generated at various parts of the conventional system of FIG. 1.
Figure 5:
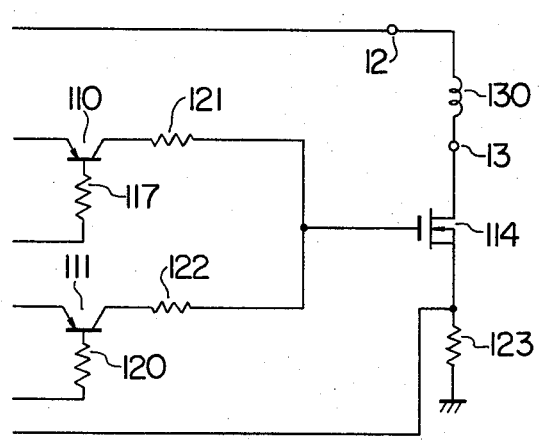
FIG. 5 is an electrical circuit diagram of the essential parts of a second embodiment of the present invention.
Figure 6:
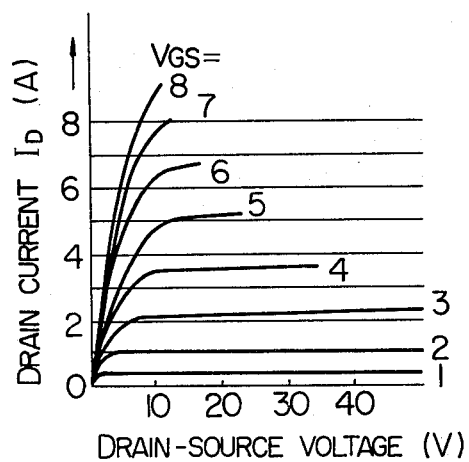
FIG. 6 shows characteristics of the field effect transistor shown in FIG. 3.

A second embodiment shown in FIG. 5 will be explained. In the above-mentioned first embodiment of FIG. 3, the NPN power transistor 113 is used at the rise portion of the injector current where a large current is required, and the field effect transistor 114 is used when the current is small, removing the problem that since as shown in FIG. 6 the characteristics of the field effect transistor are such that when the drain-source voltage is decreased, the current capable of being supplied is reduced even if the gate voltage is the same, it then becomes impossible to supply a sufficient current required for driving the injector when the voltage across the battery mounted in the car drops to, say, lower than 10 volts. In the case where the current to the injector is sufficiently large at the time of a drop of the battery voltage or when the characteristics of the field effect transistor are improved, however, the power transistor 113 need not be used but the field effect transistor 114 may be used also therefor as shown by the second embodiment of FIG. 5. The other circuit configuration and the operation thereof are the same as those of the first embodiment and the description is omitted.

I claim:

1. An injector drive circuit for an injector opened in response to an electrical pulse signal with a time width corresponding to the amount of fuel to be supplied to the engine comprising:

a field effect transistor having a drain-source path connected in series with said injector for supplying current to said injector; and a switching circuit for determining whether a first predetermined current is supplied to said injector after the rise of said electrical pulse, and for controlling current supplied to said injector at a second current value by holding the gate potential of said field effect transistor at a predetermined set potential level for a time period during which said electrical pulse signal is produced after said first predetermined current is supplied to said injector, said switching circuit including:

a first D-type flip-flop having a preset terminal, a data terminal, a clock terminal and an inverted output terminal, means for presetting said first flip-flop when said first predetermined current is supplied to said injector, means for setting said first flip-flop to a state defined by the voltage on said first flip-flop data terminal in response to the rise of said electrical pulse signal, a second D-type flip-flop having a preset terminal, a data terminal and an output terminal, means for presetting said second flip-flop when said first predetermined current is applied to said injector, means for setting said second flip-flop to a state defined by said second flip-flop dated terminal in response to the fall of said electrical pulse signal, a first gate having two inputs responsive to said electrical pulse signal and a signal at said first flip-flop inverted output, respectively, said first gate being activated when said electrical signal is applied while said first flip-flop is set, a power transistor for supplying current to said injector, said power transistor becoming conductive when said first gate is activated, a second gate having two inputs responsive to said electrical pulse signal and a signal at said second flip-flop output terminal, respectively, said second gate being activated when said second flip-flop is preset while said electrical pulse signal is being applied, and means for rendering conductive said field effect transistor when said second gate is activated.

2. An injector drive circuit for an injector opened in response to an electrical pulse signal with a time width corresponding to the amount of the fuel to be supplied to the engine comprising:

a field effect transistor having a drain-source path connected in series with said injector for supplying current to said injector; and a switching circuit for determining whether a first predetermined current is supplied to said injector after the rise of said electrical pulse signal, and for fixing current through said field effect transistor to a fixed second predetermined level by holding the gate potential of said field effect transistor at a predetermined set potential level corresponding to said second predetermined level for a time period during which said electrical pulse signal is produced after said first predetermined current is supplied to said injector.

3. An injector drive circuit according to claim 2, wherein said switching circuit comprises first and second D-type flip-flops and first and second gate circuits, said first and second D-type flip-flops being initially reset, said first D-type flip-flop being preset when it is determined that said first predetermined current is supplied to said injector and being set to a state defined by the input D of the flip-flop in response to the rise of said electrical pulse signal, said second D-type flip-flop being preset when it is determined that said first predetermined current is supplied to said injector and being set to a state defined by the input D of the flip-flop in response to the fall of said electrical pulse signal, said first gate having two inputs to which said electrical pulse signal and an inverted output of said first D-type flip-flop are applied respectively and being activated when said electrical signal is applied while said first D-type flip-flop is set to make a power transistor for supplying current to said injector conductive, said second gate having two inputs to which said electrical pulse signal and an output of said second D-type flip-flop are applied respectively and being activated when said second D-type flip-flop is preset while said electrical pulse signal is being applied to make said field effect transistor conductive.

4. An injector drive circuit according to claim 1 or 2, wherein said injector drive circuit includes a reset circuit having a series circuit of a first resistor and a capacitor to which circuit a power source is connected, and an inverter connected to the junction point of said first resistor and said capacitor through a second resistor, said reset circuit producing a pulsive reset signal in response to switching on of the power source, said reset signal being applied to said first and second D-type flip-flops to reset the same.

5. An injection drive circuit according to claim 1 or 3, wherein a resistor for detecting current is connected in series with said power transistor, and said switching circuit includes a comparator for comparing an output voltage produced at said resistor with a predetermined reference voltage obtained by a means for supplying the reference voltage, said means having a series circuit of a resistor and variable resistor, said comparator producing a signal indicative of that said first predetermined current is supplied to said injector when said output voltage exceeds said reference voltage.

6. In an injector drive circuit for a fuel injection system comprising a control circuit for calculating the amount of the fuel supplied to the engine as a time width of an electrical pulse signal and an injector opened in accordance with the time width of said electrical pulse signal of said control circuit for supplying by injection the fuel to said engine; the improvement further comprising a power transistor in series with said injector for supplying a large current at the time of opening of said injector, a field effect transistor connected in series with said injector and in parallel to said power transistor for supplying a comparatively small current for holding the open state of said injector after the opening of said injector, and a switching circuit for turning on said power transistor only during the time period from the supply of said electrical pulse signal from said control circuit to the supply of a peak current of a predetermined value to said injector, said switching circuit holding the gate potential of said field effect transistor at a predetermined set potential only during that part of said time width of said electrical pulse signal when said power transistor is not conductive, thus turning on said field effect transistor.

* * * * *